(12) United States Patent
Shibata et al.

(10) Patent No.: US 11,984,879 B2
(45) Date of Patent: May 14, 2024

(54) DRIVE CIRCUIT

(71) Applicant: TAMURA CORPORATION, Tokyo (JP)

(72) Inventors: Hisashi Shibata, Saitama (JP);
Tomohiko Yoshino, Saitama (JP);
Hiroo Ogawa, Saitama (JP)

(73) Assignee: TAMURA CORPORATION, Tokyo (JP)

( * ) Notice: Subject to any disclaimer, the term of this patent is extended or adjusted under 35 U.S.C. 154(b) by 0 days.

(21) Appl. No.: 17/674,764

(22) Filed: Feb. 17, 2022

(65) Prior Publication Data

US 2022/0294442 A1 Sep. 15, 2022

(30) Foreign Application Priority Data

Mar. 11, 2021 (JP) .................................. 2021-039177

(51) Int. Cl.
*H03K 17/0812* (2006.01)

(52) U.S. Cl.
CPC .............................. *H03K 17/08128* (2013.01)

(58) Field of Classification Search
CPC ....... H03K 17/08128; H03K 17/04123; H03K 17/0822; H03K 17/0828; H02H 3/087; H02H 3/093; H02H 7/222; H02M 1/08; H02M 1/32
See application file for complete search history.

(56) References Cited

FOREIGN PATENT DOCUMENTS

| JP | 2004140891 | 5/2004 | |
|---|---|---|---|
| WO | 2021037580 | 3/2021 | |
| WO | WO-2021037580 A1 * | 3/2021 | ....... H03K 17/08128 |

OTHER PUBLICATIONS

"Search Report of Europe Counterpart Application", dated Jul. 13, 2022, p. 1-p. 8.
"Office Action of Europe Counterpart Application", issued on Feb. 5, 2024, pp. 1-9.

* cited by examiner

*Primary Examiner* — Metasebia T Retebo
*Assistant Examiner* — James G Yeaman
(74) *Attorney, Agent, or Firm* — JCIPRNET

(57) ABSTRACT

A drive circuit is provided. When the switching element is in turn-on state and a collector-emitter voltage of the switching element is equal to or higher than a first predetermined voltage value, the first diode is turned on; the first transistor and the second transistor are turned on; and, after a mask time in which a first capacitor is started to be charged with a current from a current source and a voltage value at two ends becomes equal to or higher than a second predetermined voltage value higher than the first predetermined voltage value, an abnormality detection signal is output to the control unit. The control unit stops an output of the pulse signal to the switching element in response to the abnormality detection signal.

12 Claims, 12 Drawing Sheets g501:

| | Switching element 41 | Diode D22 | Transistor Q21 (First transistor) | Transistor Q22 (Second transistor) | Transistor Q11 |
|---|---|---|---|---|---|
| Turn-off | OFF | OFF | OFF | OFF | ON |
| Turn-on (normal) | ON | OFF | OFF | OFF | OFF |
| Turn-on (abnormal) | ON | ON | ON | ON | OFF | g502:

| | Switching element 41 | Diode D22 | Transistor Q21B (First transistor) | Transistor Q22 (Second transistor) | Transistor Q11 |
|---|---|---|---|---|---|
| Turn-off | OFF | ON | ON | ON | ON |
| Turn-on (normal) | ON | OFF | OFF | OFF | OFF |
| Turn-on (abnormal) | ON | ON | ON | ON | OFF | g503:

| | Switching element 41 | Diode D22 | Transistor Q23 (First transistor) | Transistor Q22 (Second transistor) | Transistor Q11 |
|---|---|---|---|---|---|
| Turn-off | OFF | OFF | OFF | OFF | ON |
| Turn-on (normal) | ON | OFF | ON | OFF | OFF |
| Turn-on (abnormal) | ON | ON | OFF | ON | OFF | g504:

| | Switching element 41 | Diode D22 | Transistor Q23 (First transistor) | Transistor Q22 (Second transistor) | Transistor Q11 |
|---|---|---|---|---|---|
| Turn-off | OFF | ON | OFF | ON | ON |
| Turn-on (normal) | ON | OFF | ON | OFF | OFF |
| Turn-on (abnormal) | ON | ON | OFF | ON | OFF |

FIG.9

DRIVE CIRCUIT

CROSS-REFERENCE TO RELATED APPLICATION

This application claims the priority benefits of Japanese application no. 2021-039177, filed on Mar. 11, 2021. The entity of the above-mentioned patent application is hereby incorporated by reference herein and made a part of the specification.

BACKGROUND

Technical Field

The disclosure relates to a drive circuit.

Related Art

Insulated Gate Bipolar Transistors (IGBTs) that switch between high voltages and large currents can cause serious damage to peripheral devices if they are destroyed by overcurrent flows caused by short circuits in connected loads, so it is necessary to avoid destruction as much as possible. For this reason, it is important for drive circuits that drive IGBTs to have a function of protecting the IGBTs against such a situation. One method of detecting an abnormality in which an overcurrent flows due to a short circuit in a load or the like is to detect the increase in collector-emitter voltage (Vce) when the IGBT is turned on. In this conventional method, a certain period of time may be provided from the detection of an abnormality to the transmission of an abnormality detection signal. This certain period of time is the time to keep waiting for the transmission of the abnormality detection signal and is referred to as a mask time. The mask time must have a certain accuracy in order to prevent false detection and IGBT overload.

FIG. 12 is a circuit diagram of a drive circuit in which a gate driver 900 according to the conventional technology drives an IGBT 912. As shown in FIG. 12, the gate driver 900 includes an inverter 916, a comparator 918, a transistor Q901, and a current source Idesat. A voltage Vdd is supplied to the current source Idesat. Further, a capacitor Cdesat, a buffer circuit 920, a diode Ddesat, and the IGBT 912 are connected to the gate driver 900. A reference voltage Vdesatth is input to one end of an input end of the comparator 918. Further, a pulse signal with alternating high-level (VGH) and low-level (VGL) is input from an OUT terminal 914 of the gate driver 900.

Here, the operation when the IGBT 912 normally repeats the on operation and the off operation will be described. During OFF operation of the IGBT 912, the output value of the OUT terminal 914 is at low-level, and the transistor Q901 of the gate driver 900 conducts an ON operation to discharge the charge of the capacitor Cdesat to zero. When the IGBT 912 turns to ON operation, the output value of the OUT terminal 914 is high-level, such that a low-level signal is input to a base of the transistor Q901 via the inverter 916. As a result, the transistor Q901 turns to OFF operation, but since voltage Vce of the IGBT 912 becomes saturation voltage, the current of the current source Idesat flows to the collector terminal of the IGBT 912 via the diode Ddesat.

As a result, the capacitor Cdesat is charged to a voltage that sums a forward voltage of the diode Ddesat based on the current source Idesat and the collector-emitter saturation voltage of the IGBT 912. That is, the voltage between the terminals of the capacitor Cdesat is the saturation voltage+ the forward voltage of the diode Ddesat. Since the voltage of a DESAT terminal of the gate driver 900 maintains a voltage lower than the reference voltage Vdesatth, the comparator 918 does not invert the value of the output signal and therefore does not output an abnormality detection signal.

When an abnormality occurs in a load connected to the IGBT 912, an overcurrent flows through the IGBT 912, and the voltage Vce rises to reach the positive-side power supply Vcc level, the diode Ddesat is cut off. Then, the current of the current source Idesat flows into the capacitor Cdesat, and the voltage between the terminals of the capacitor Cdesat rises to reach the reference voltage Vdesatth. As a result, the comparator 918 inverts the output value and outputs an abnormality detection signal. The output signal of the comparator 918 becomes high-level when the voltage between the terminals of the capacitor Cdesat is higher than the reference voltage Vdesatth, which represents an abnormality detection signal. Further, a mask time Tw from when an abnormality occurs in the load connected to the IGBT 912 until the gate driver 900 outputs an abnormality detection signal is set. The gate driver 900 outputs this abnormality detection signal to an external device (not shown). Based on the input abnormality detection signal, the external device switches the signal of the gate of the IGBT 912 to low-level. The mask time Tw is about 6.9 (μs) when the inductance at short circuit of the load connected to the IGBT 912 is small at about 200 (nH), and is about 1.0 (μs) when the inductance at short circuit of the load is large at about 8 (nH). In the case of a load short circuit, the diode Ddesat is in an open state, and a signal from the DESAT terminal flows to the capacitor Cdesat.

RELATED ART

Patent Literature

[Patent Literature 1] Japanese Unexamined Patent Publication No. 2004-140891

The conventional drive circuit as described above has a problem that the mask time for the purpose of preventing false detection varies depending on the load conditions at the time of short circuit.

The disclosure has been made in view of the above problem, and an object of the disclosure is to provide a drive circuit capable of improving the accuracy of mask time.

SUMMARY (1) The drive circuit according to one aspect of the disclosure is a drive circuit driving a switching element (41) by a pulse signal. The drive circuit includes a first diode (D22); a first transistor (Q21) and a transistor (Q22), turned off when the first diode is turned off and turned on when the first diode is turned on; a first capacitor (Cdesat); and a control unit (30) controlling whether or not to output the pulse signal to the switching element. When the switching element is in turn-on state and a collector-emitter voltage of the switching element is equal to or higher than a first predetermined voltage value, the first diode is turned on; the first transistor and the second transistor are turned on; and, after a mask time in which the first capacitor is started to be charged with a current from a current source and a voltage value at two ends becomes equal to or higher than a second predetermined voltage value higher than the first predetermined voltage value, an abnormality detection signal is output to the control unit. The control unit stops an output of the pulse signal to the switching element in response to the abnormality detection signal.

(2) The drive circuit according to one aspect of the disclosure is a drive circuit that drives the switching element (41) by a pulse signal. The drive circuit includes a first diode (D22); a first transistor (Q23); a second transistor (Q22C); a first capacitor (Cdesat); and a control unit (30) controlling whether or not to output the pulse signal to the switching element. When the switching element is in turn-on state and a collector-emitter voltage of the switching element is equal to or higher than a first predetermined voltage value, the first diode is turned on; the first transistor is turned off and the second transistor is turned on; and, after a mask time in which the first capacitor is started to be charged with a current from a current source and a voltage value at two ends becomes equal to or higher than a second predetermined voltage value higher than the first predetermined voltage value, an abnormality detection signal is output to the control unit. The control unit stops an output of the pulse signal to the switching element in response to the abnormality detection signal.

BRIEF DESCRIPTION OF THE DRAWINGS

FIG. 9 is a diagram showing an operating state of each element of the first implementation example to the fourth implementation example.

DESCRIPTION OF THE EMBODIMENTS

Hereinafter, embodiments of the disclosure will be described with reference to the drawings.

Figure 1:
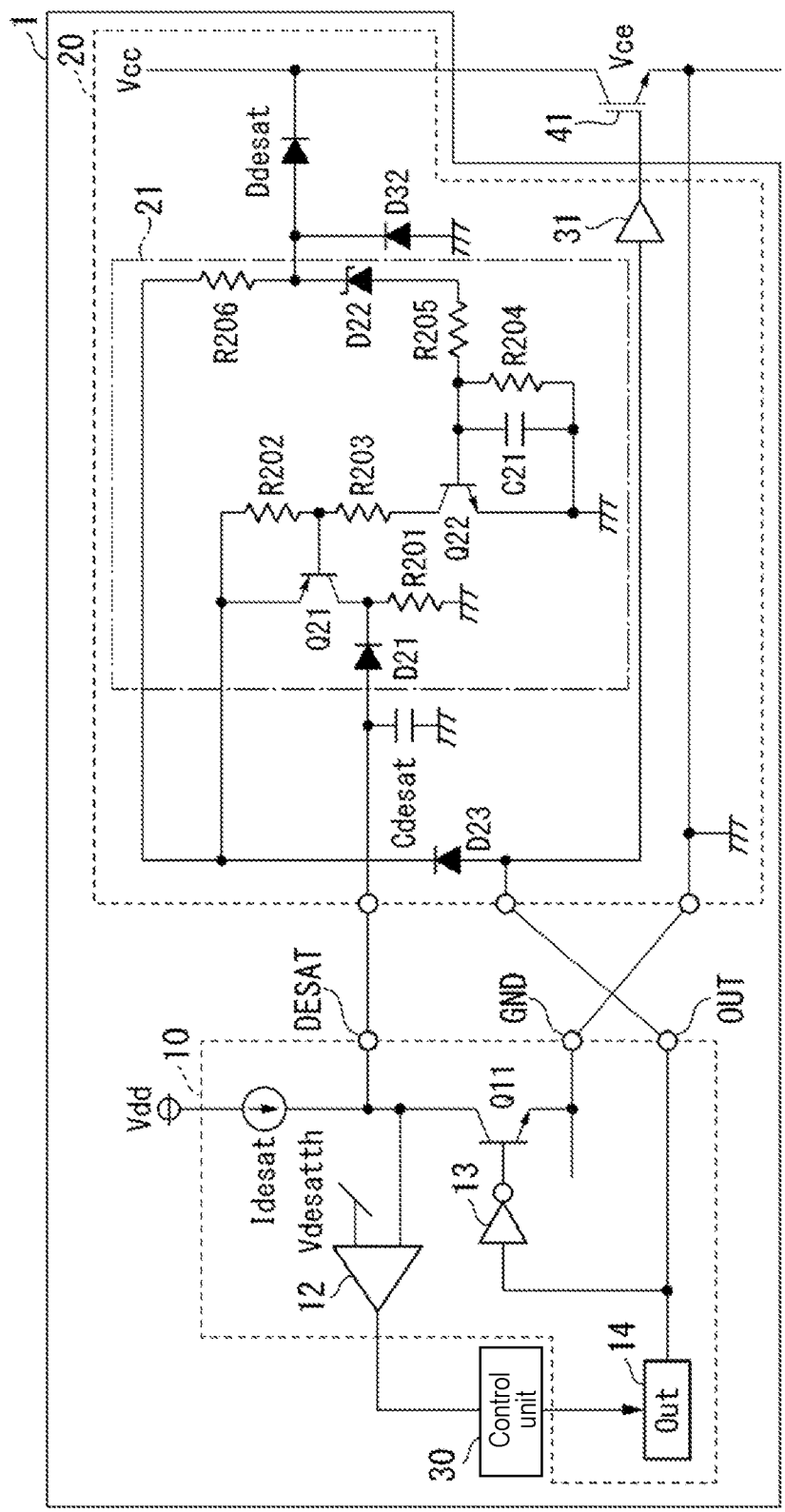
FIG. 1 is a circuit diagram of a drive circuit according to an embodiment.

FIG. 1 is a circuit diagram of a drive circuit according to the present embodiment. As shown in FIG. 1, a drive circuit 1 includes a driver 10, a DESAT (Definition of the short-cycle unit) circuit 20, and a control unit 30.

The driver 10 includes a transistor Q11, a comparator 12, an inverter 13, an Out terminal 14, a current source Idesat, a DESAT terminal, an OUT terminal, and a GND terminal.

The DESAT circuit 20 includes a capacitor Cdesat (first capacitor), a diode D21 (fourth diode), a transistor Q21 (first transistor), a resistor R201 (first resistor), a resistor R202 (second resistor), a resistor R203 (third resistor), a transistor Q22 (second transistor), a capacitor C21, a resistor R204 (fourth resistor), a resistor R205 (fifth resistor), a diode D22 (first diode), a diode D23 (third diode), a resistor R206 (sixth resistor), a buffer 31, a diode D32, and a diode Ddesat (second diode). A circuit block 21 includes the diode D21, the transistor Q21, the resistor R201, the resistor R202, the resistor R203, the transistor Q22, the capacitor C21, the resistor R204, the resistor R205, the diode D22, and the resistor R206. The circuit block 21 will be described later.

The configuration of the circuit shown in FIG. 1 is an example, and the drive circuit 1 may include other components (for instance, a noise removing capacitor).

The drive circuit 1 drives a switching element 41. The switching element 41 is, for instance, an IGBT. The switching element 41 may be another power semiconductor (for instance, MOSFET) or the like.

The driver 10 is, for instance, a drive IC (integrated circuit) that drives the switching element 41. Further, when an abnormality occurs in a load connected to the switching element 41, the driver 10 outputs an abnormality detection signal to the control unit 30 after a mask time to be described later. Then, the driver 10 switches the gate level of the switching element 41 to low-level according to the control of the control unit 30.

The DESAT circuit 20 is a protection circuit that shuts off the gate based on an increase in, for instance, a collector-emitter voltage of the switching element 41, when an overcurrent flows due to a short circuit of a load or the like.

The control unit 30 controls whether or not to output a pulse signal to the switching element 41. When the abnormality detection signal is acquired from the driver 10, the control unit 30 controls the driver 10 to switch the gate level of the switching element 41 to low-level. The driver 10 may include the control unit 30.

Next, the connection relationship of the drive circuit 1 will be described. First, the connection relationship of the driver 10 will be described. In the comparator 12, a reference voltage Vdesatth (second predetermined voltage value) is connected to a first input terminal, and the current source Idesat, the DESAT terminal, and a collector of the transistor Q11 are connected to a second input terminal. The voltage Vdd is supplied to the current source Idesat. The transistor Q11 has an emitter connected to a GND terminal and a base connected to an Out terminal of the inverter 13. The inverter 13 has an input terminal connected to the Out terminal 14 and the OUT terminal. A pulse signal with alternating high-level (VGH) and low-level (VGL) are input from the Out terminal 14. The transistor Q11 is an NPN type transistor.

The current value output from the current source Idesat is, for instance, several hundred (μA), and the voltage value of the reference voltage Vdesatth is, for instance, several (V). Further, the voltage value output from the OUT terminal of the driver 10 is, for instance, 0 (V) for VGL and a dozen (V) or so for VGH.

Next, the connection relationship of the DESAT circuit 20 will be described.

The Cdesat has one end connected to the DESAT terminal (current source) of the driver 10 and the anode of the diode D21 and has another end grounded. The diode D21 has the cathode connected to one end of the resistor R201 and the collector of the transistor Q21. The resistor R201 has another end grounded. The diode D23 has the anode connected to the OUT terminal of the driver 10 and the input terminal of the buffer 31. The transistor Q21 has the emitter connected to one end of the resistor R202, the cathode of the diode D23, and one end of the resistor R206, and has a base connected to another end of the resistor R202 and one end of the resistor R203. The resistor R201 has another end connected to the collector of the transistor Q22.

The transistor Q22 has the emitter grounded and the base connected to one end of the capacitor C21, one end of the resistor R204, and one end of the resistor R205. The capacitor has another end grounded and the resistor R204 has another end grounded. The resistor R205 has another end connected to the anode of the diode D22. The diode D22 has a cathode connected to the cathode of the diode D32, the anode of the diode Ddesat, and another end of the resistor R206. The diode D32 has the anode grounded. The diode Ddesat has the cathode connected to the collector of the switching element 41.

The diode D22 is, for instance, a Zener diode. The transistor Q21 is a PNP type transistor. The transistor Q22 is an NPN type transistor. The diode Ddesat may be, for instance, a diode array composed of a plurality of diodes, or may have a plurality of diodes connected in series.

The voltage value of a forward voltage of the diode Ddesat is, for instance, about 1.5 (V), and the voltage value of the Zener voltage of the diode D22 is, for instance, a dozen (V) or so.

The switching element 41 has the gate connected to the Out terminal of the buffer 31, the power supply Vcc supplied to the collector, and the emitter grounded. The voltage value of the power supply Vcc is, for instance, several hundred (V).

Figure 12:
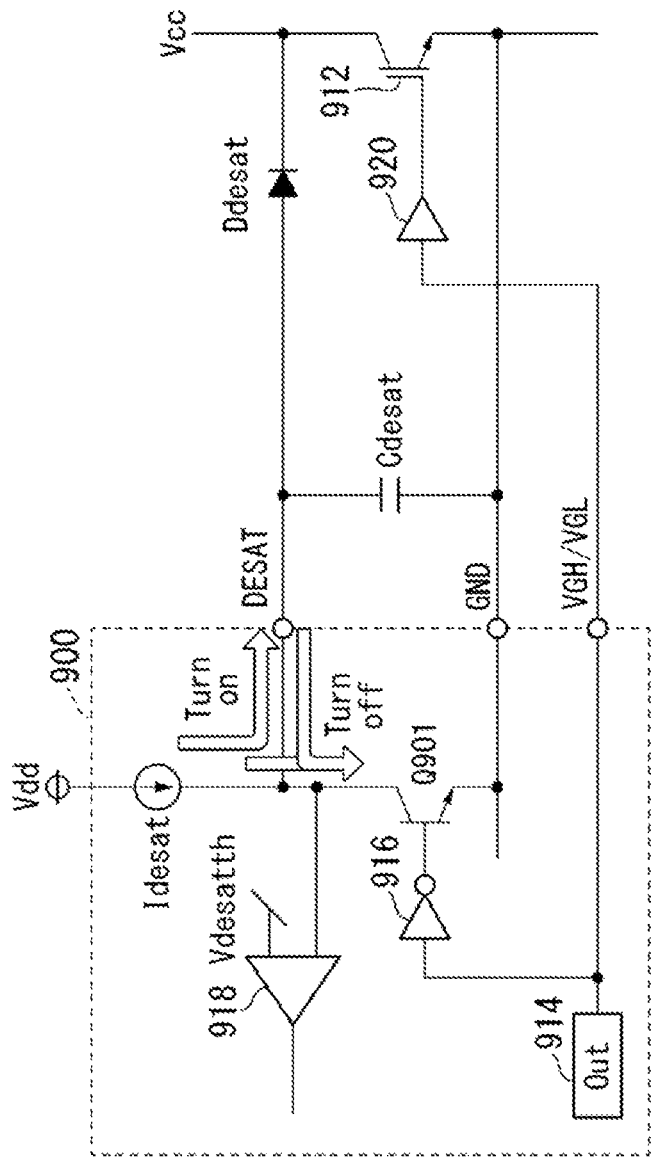
FIG. 12 is a circuit diagram of a drive circuit in which a gate driver according to the conventional technology drives an IGBT.

In the conventional DESAT circuit, as shown in FIG. 12, the DESAT terminal is directly connected to one end of the capacitor Cdesat and the anode of the diode Ddesat.

Next, the operation of the drive circuit 1 will be described.

Figure 2:
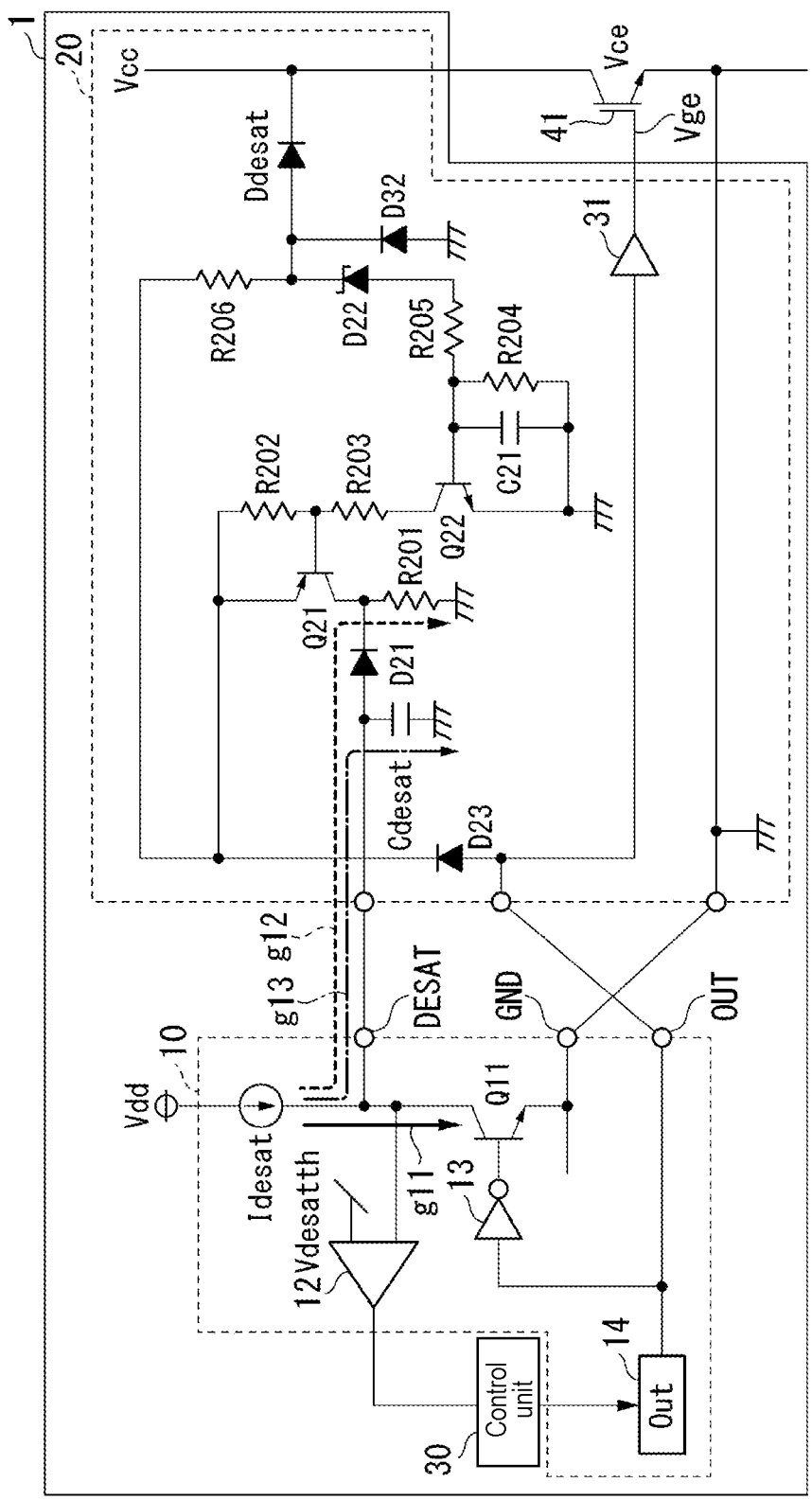
FIG. 2 is a diagram showing an operation example of a drive circuit according to an embodiment.

FIG. 2 is a diagram showing an operation example of the drive circuit according to the present embodiment.

The diode D22 operates as a switching element based on the voltage at two ends. The resistor R202 and the resistor R203 operate as a voltage dividing circuit for the voltage applied to the base of the transistor Q21. The resistor R204 and the resistor R205 operate as a voltage dividing circuit for the voltage applied to the base of the transistor Q22. The resistor R201 has a role of suppressing the voltage at a level that does not exceed the reference voltage Vdesatth of the driver 10. The resistor R206 has a role of controlling such that the current does not flow excessively. The transistor Q21 and the transistor Q22 control the charging and discharging of the capacitor Cdesat. The capacitor C21 is for noise removal.

During turn-off (off control) period of the switching element 41, that is, the period when the output from the OUT terminal of the driver 10 is at low-level (VGL), the switching element 41 is turned off because the output of the buffer 31 is at low-level, and the collector voltage of the switching element 41 becomes high. Therefore, during this period, in the DESAT circuit 20, the diode D22 is turned off, and the transistor Q21 and the transistor Q22 are turned off. Then, the driver 10 causes a current to flow from the current source Idesat to the transistor Q11 and not output from the DESAT terminal to the DESAT circuit 20. As a result, the voltage value at the two ends of the capacitor Cdesat is about 0 (V) (line g11). The transistor Q11 of the driver 10 is turned on during the turn-off (off control) period of the switching element 41.

In this way, in the present embodiment, when the switching element 41 is in turn-on state and the Vce is lower than the first predetermined voltage value and normal, the diode D22 is turned off and the transistor Q21 is turned off, such that the DESAT terminal is set to 0 (V). When the switching element 41 is in turn-on state and the Vce is lower than the first predetermined voltage value and normal, the transistor Q11 of the driver 10 is turned off. As a result, according to the present embodiment, the initial voltage of the capacitor Cdesat is fixed at 0 (V). Thereby, according to the present embodiment, it is possible to control the initial charge of the capacitor Cdesat that determines the time constant and reduce the fluctuation of the mask time.

During the turn-on (on control) period of the switching element 41, that is, the period when the output from the OUT terminal of the driver 10 is at high-level (VGH), the switching element 41 is turned on because the output of the buffer 31 is at high-level. Further, during this period, a voltage is applied to the emitter of the transistor Q21 and the resistor R202, and a voltage is applied to the resistor R206 via the diode D23. During this period, when the Vce of the switching element 41 is lower than the first predetermined voltage value and normal, in the DESAT circuit 20, the diode D22 is turned off, and the transistor Q21 and the transistor Q22 are turned off. As a result, the driver 10 outputs the current supplied from the current source Idesat to the DESAT terminal. Then, the current output from the DESAT terminal of the driver 10 is charged to the capacitor Cdesat of the DESAT circuit 20 up to a third predetermined voltage value of the following equation (1) (line g12).

[Equation 1]

$$\text{Cdesat charge voltage} = D21\_VF + (\text{Idesat} \times R201) \quad (1)$$

In the equation (1), D21_VF is the forward voltage VF of the diode D21, Idesat is the current value of the current source Idesat, and R201 is the resistance value of the resistor R201.

When the switching element 41 is in the turn-on period and the Vce of the switching element 41 rises abnormally to equal to or higher than the first predetermined voltage value, in the DESAT circuit 20, since the voltage on the anode side of the diode Ddesat rises, the diode D22 is turned on and the transistor Q21 and the transistor Q22 are turned on. When the transistor Q21 is turned on, the diode D21 is turned off. Then, the capacitor Cdesat starts charging the current output from the DESAT terminal of the driver 10, and stops the charging operation when the reference voltage Vdesatth (second predetermined voltage value) or higher is reached (line g13). When the switching element 41 is in turn-on state and the Vce rises abnormally to equal to or higher than the first predetermined voltage value, the transistor Q11 of the driver 10 is turned off. Then, the driver 10 outputs an abnormality detection signal to the control unit 30 after the mask time Tw when the capacitor Cdesat reaches the third predetermined voltage value, and switches the gate level of the switching element 41 to low-level according to the control of the control unit 30. The mask time Tw is determined by the following equation (2). Further, the second predetermined voltage value is higher than the third predetermined voltage value. The first predetermined voltage value is a voltage value based on the characteristics of the switching element 41.

[Equation 2]

$$Tw = \frac{(Vdesatth - D21\_VF - Idesat \times R201) \times Cdesat \text{ electrostatic capacitance}}{Idesat} \quad (2)$$

In the equation (2), Vdesatth is the reference voltage value, D21_VF is the forward voltage VF of the diode D21, Idesat is a current value of the current source Idesat, and R201 is a resistance value of the resistor R201.

According to the present embodiment as in the equation (2), a certain mask time Tw can be realized. Further, in the present embodiment, the mask time can be arbitrarily selected by the forward voltage VF of the diode D21 and the resistance value of the resistor R201. Therefore, it is also possible to have a larger false detection margin against noise and the like. Thereby, according to the present embodiment, the mask time Tw from the occurrence of an abnormality in the load connected to the switching element 41 to the output of the abnormality detection signal by the driver 10 can be made constant.

Here, the role of the diode D21 will be described.

In FIG. 1, when the transistor Q21 is turned on, the voltage on the cathode side of the diode D21 may increase. In this case, the voltage on the cathode side of the diode D21 may exceed the withstand voltage of the DESAT terminal of the driver 10. In this way, the diode D21 is for protecting the DESAT terminal of the driver 10. When the withstand voltage of the DESAT terminal of the driver 10 is high, the DESAT circuit 20 does not have to include the diode D21.

With the above configuration, in the present embodiment, the accuracy of the mask time can be improved by a simple circuit configuration. The simulation results will be described later.

First Implementation Example

Figure 3:
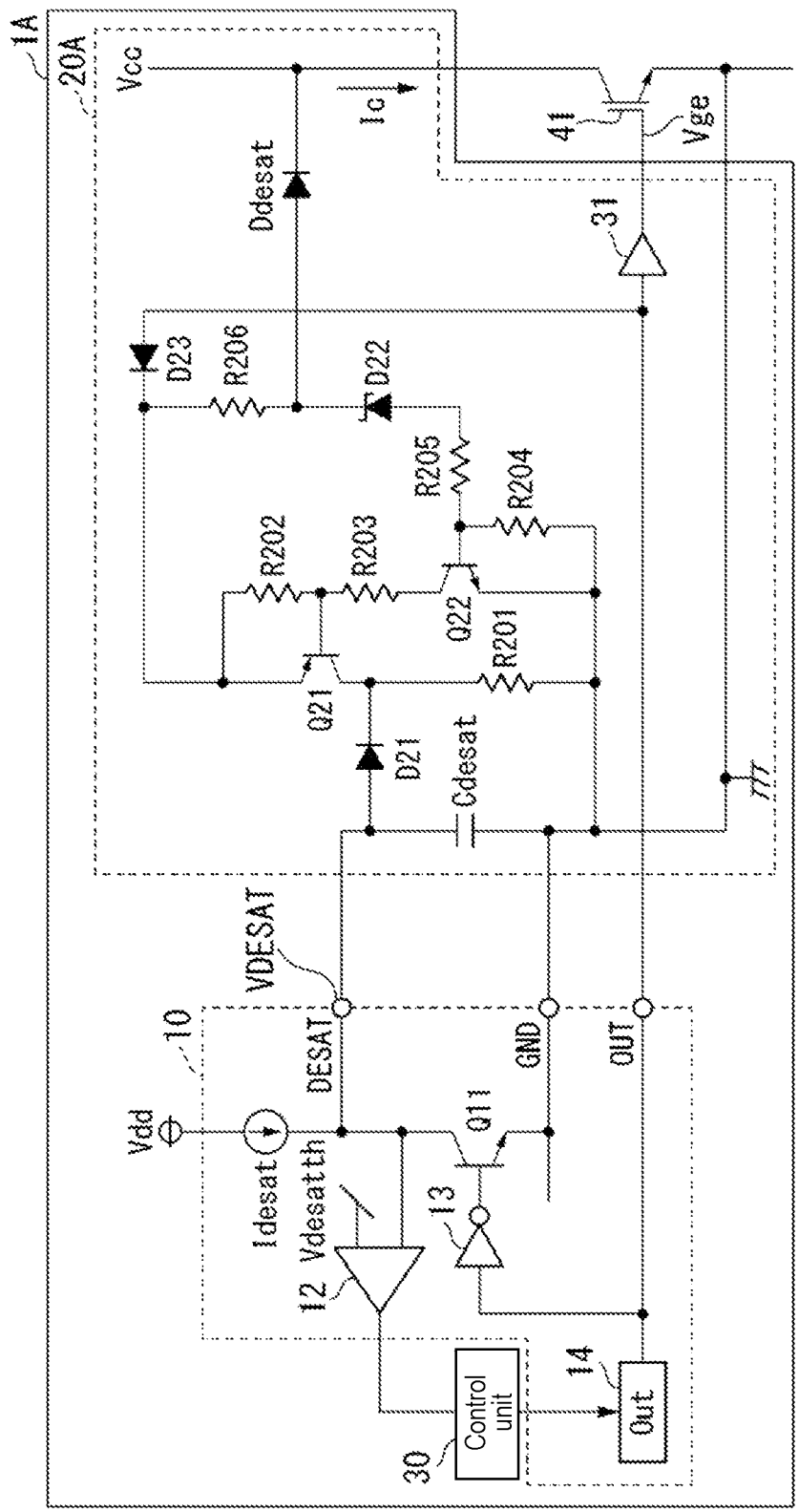
FIG. 3 is a circuit diagram of a drive circuit according to a first implementation example.

Next, the first implementation example will be described. FIG. 3 is a circuit diagram of the drive circuit according to the first implementation example. As shown in FIG. 3, a drive circuit 1A includes the driver 10 and a DESAT circuit 20A.

The DESAT circuit 20A includes the capacitor Cdesat (first capacitor), the diode D21 (fourth diode), the transistor Q21 (first transistor), the resistor R201 (first resistor), the resistor R202 (second resistor), and the resistor R203 (third resistor), the transistor Q22 (second transistor), the resistor R204 (fourth resistor), the resistor R205 (fifth resistor), the Diode D22 (first diode), the Diode D23 (third diode), the resistor R206 (sixth resistor), the buffer 31, and the diode Ddesat (second diode).

FIG. 9 is a diagram showing an operating state of each element of the first implementation example to the fourth implementation example. The operation of the drive circuit 1A of FIG. 3 is the same as that of the drive circuit 1 of FIG. 1 as shown in Table g501 of FIG. 9.

As shown in FIGS. 1 and 3, the DESAT circuit 20A does not include the capacitor C21 included in the DESAT circuit 20. In this way, the DESAT circuit 20 does not have to include the capacitor C21. Further, in FIG. 3, the diode Ddesat is represented by one diode, but the diode Ddesat may be composed of a plurality of diodes.

Second Implementation Example

Figure 4:
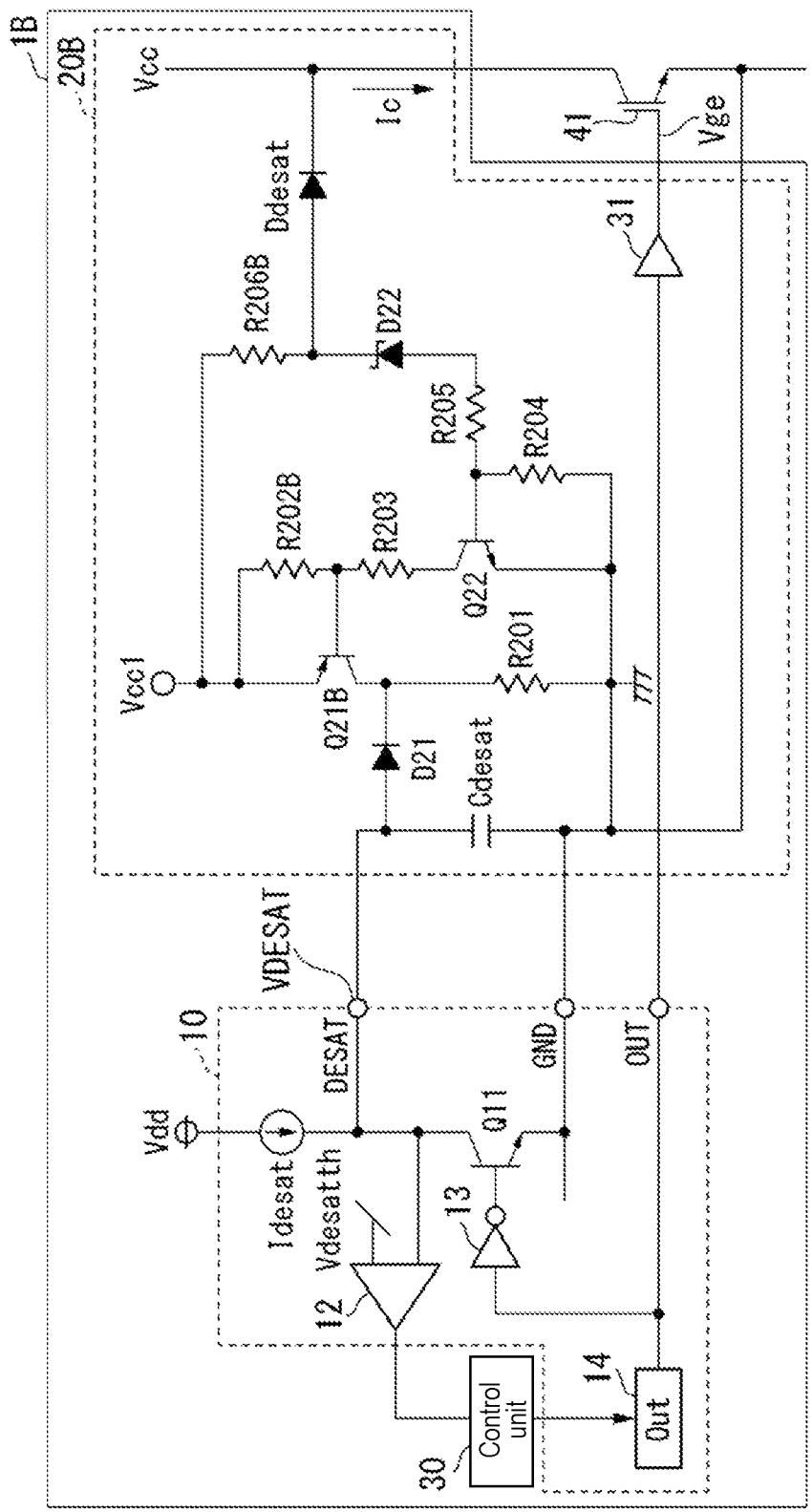
FIG. 4 is a circuit diagram of a drive circuit according to a second implementation example.

Next, a second implementation example will be described. FIG. 4 is a circuit diagram of the drive circuit according to the second implementation example. As shown in FIG. 4, a drive circuit 1B includes the driver 10 and a DESAT circuit 20B.

The DESAT circuit 20B includes the capacitor Cdesat (first capacitor), the diode D21 (fourth diode), a transistor Q21B (first transistor), the resistor R201 (first resistor), the resistor R202B (second resistor), and the resistor R203 (third resistor), the transistor Q22 (second transistor), the resistor R204 (fourth resistor), the resistor R205 (fifth resistor), the diode D22 (first diode), a resistor R206B (sixth resistor), the buffer 31, and the diode Ddesat (second diode) is provided.

As shown in FIG. 4, the DESAT circuit 20B does not include the diode D23 with respect to FIG. 3, and a positive voltage Vcc1 is connected to the emitter of the transistor Q21B, the resistor R202B, and the resistor R206B. The voltage value of the positive voltage Vcc1 is, for instance, a dozen (V) or so.

In the DESAT circuit 20A of the first implementation example, a voltage is applied to the emitter of the transistor Q21, the resistor R202, and the resistor R206 during the period when the pulse signal is at high-level, but in the DESAT circuit 20B of the second implementation example, a voltage is supplied to the emitter of the transistor Q21, the resistor R202B, and the resistor R206B regardless of the level of the pulse signal.

As shown in Table g502 of FIG. 9, in the DESAT circuit 20B of the second implementation example, when the switching element 41 is in turn-off state, the diode D22 is turned on, the transistor Q21B and the transistor Q22 are turned on, and the transistor of the transistor Q11 of the driver 10 is turned on.

As shown in Table g502 of FIG. 9, in the DESAT circuit 20B of the second implementation example, when the switching element 41 is in turn-on state and the Vce is lower than the first predetermined voltage value and normal, the diode D22 is turned off, the transistor Q21B and the transistor Q22 are turned off, and the transistor Q11 of the driver 10 is turned off. Then, the current output from the DESAT terminal of the driver 10 is charged to the capacitor Cdesat of the DESAT circuit 20B up to the third predetermined voltage value of the equation (1).

As shown in Table g502 of FIG. 9, when the switching element 41 is in turn-on state and the Vce rises abnormally to equal to or higher than the first predetermined voltage value, in the DESAT circuit 20B, the diode D22 is turned on, the transistor Q21B and the transistor Q22 are turned on, and the transistor Q11 of the driver 10 is turned off. Then, the capacitor Cdesat starts charging the current output from the DESAT terminal of the driver 10, and stops the charging operation when the reference voltage Vdesatth (second predetermined voltage value) or higher is reached. Then, the driver 10 outputs an abnormality detection signal to the control unit 30 after the mask time Tw when the capacitor Cdesat reaches the third predetermined voltage value, and switches the gate level of the switching element 41 to low-level according to the control of the control unit 30. The mask time Tw is determined by the equation (2).

Next, examples of the waveform simulation result will be described with respect to the configurations of the first implementation example and the second implementation example.

Figure 5:
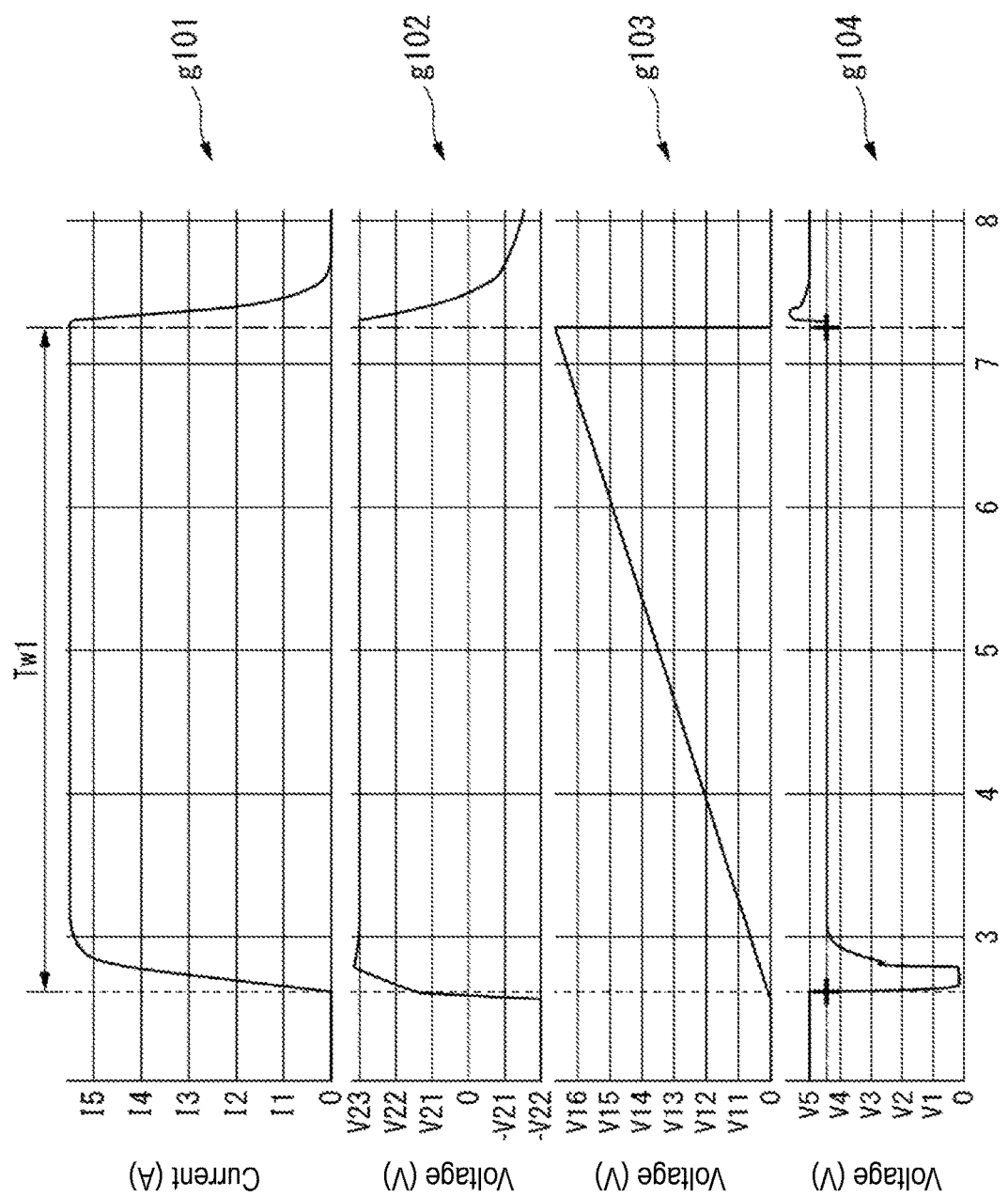
FIG. 5 is a diagram showing simulation waveforms when the inductance value of the load at short circuit is small in the first implementation example and the second implementation example.

FIG. 5 is a diagram showing simulation waveforms when the inductance value of the load at short circuit is small in the first implementation example and the second implementation example. In FIG. 5, the horizontal axis represents time (μs), and the vertical axis represents voltage value (V) and current value (A). Waveform g101 is a waveform of a current Ic flowing through the collector of the switching element 41. Waveform g102 is a waveform of a gate voltage Vge of the switching element 41. Waveform g103 is a waveform of a voltage VDESAT of the DESAT terminal. Waveform g104 is a waveform of the collector-emitter voltage Vce of the switching element 41. The Desaturation state is a state in which the switching element 41 is unsaturated.

As shown in FIG. 5, a mask time Tw1 when the inductance value of the load at short circuit is small is at about 4.6 (μs).

Figure 6:
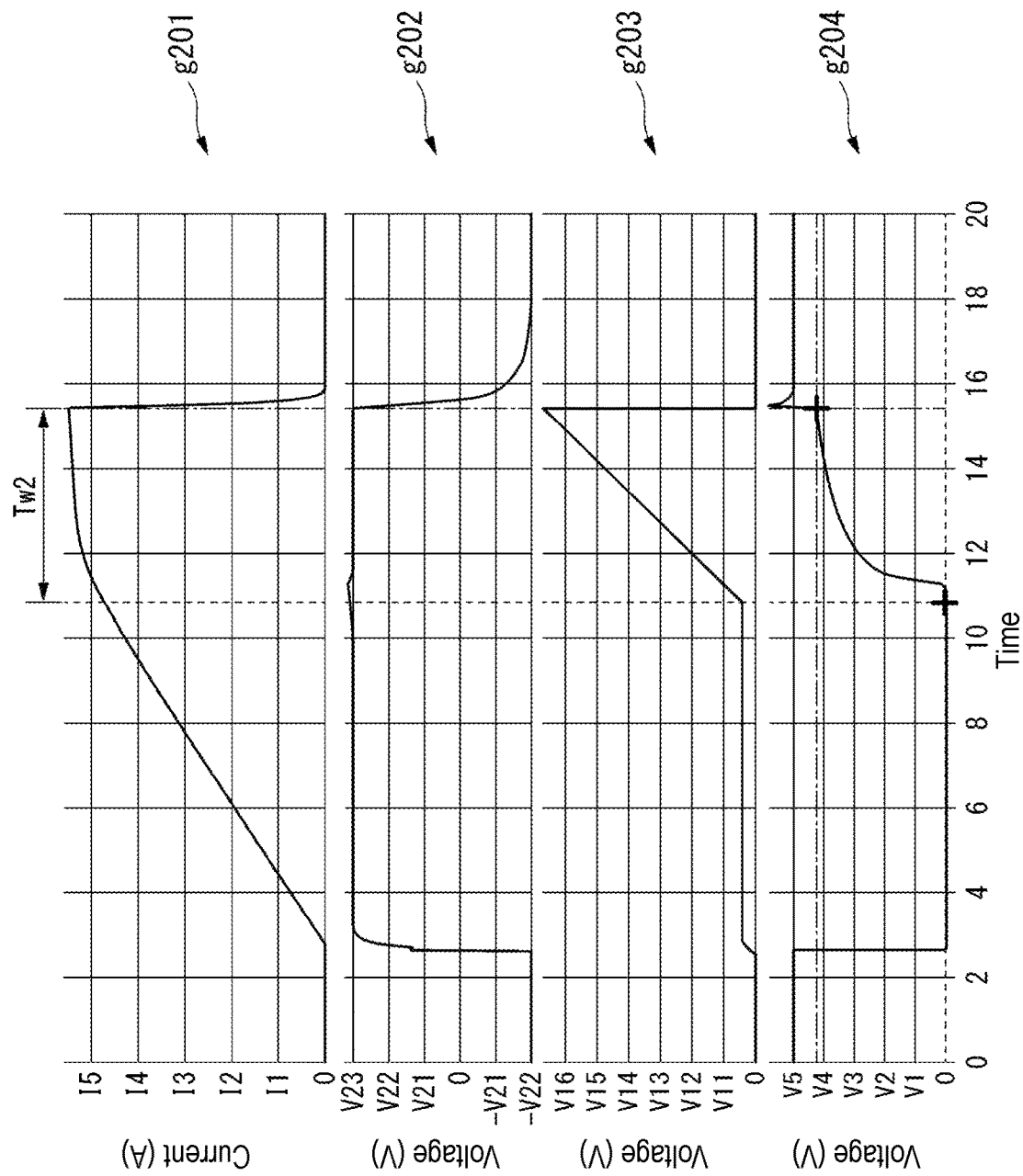
FIG. 6 is a diagram showing simulation waveforms when the inductance value of the load at short circuit is large in the first implementation example and the second implementation example.

FIG. 6 is a diagram showing simulation waveforms when the inductance value of the load at short circuit is large in the first implementation example and the second implementation example. In FIG. 6, the horizontal axis represents time, and the vertical axis represents voltage value (V) and current value (A). Waveform g201 is a waveform of the current Ic. Waveform g202 is a waveform of the gate voltage Vge. Waveform g203 is a waveform of the voltage VDESAT. Waveform g204 is a waveform of voltage Vce.

As shown in FIG. 6, a mask time Tw2 when the inductance value of the load at short circuit is large is about 4.5 (μs).

According to the configurations of the first implementation example and the second implementation example as shown in FIGS. 5 and 6, the mask time is the same even if the inductance value of the load varies.

Third Implementation Example

Figure 7:
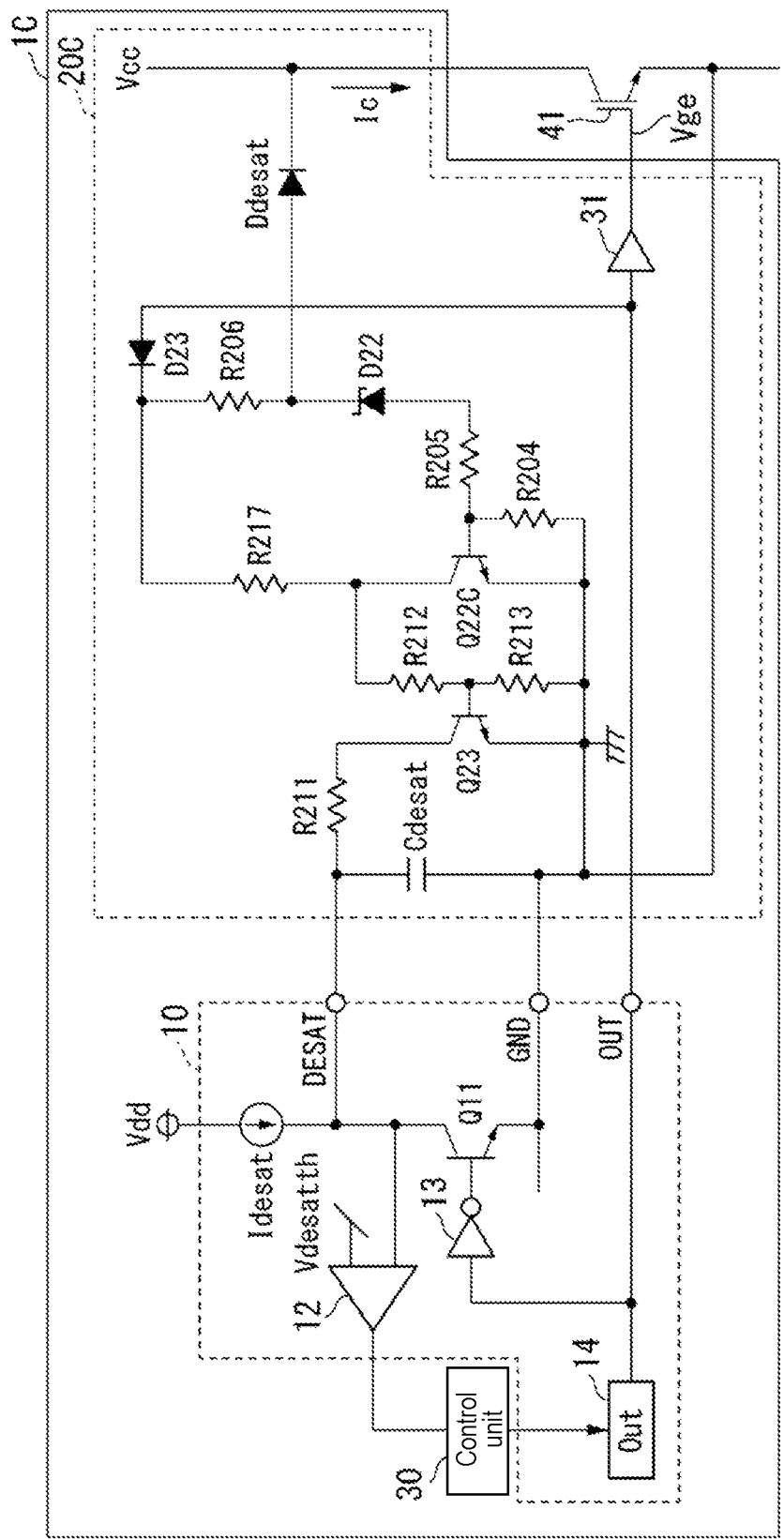
FIG. 7 is a circuit diagram of a drive circuit according to a third implementation example.

Next, a third implementation example will be described. FIG. 7 is a circuit diagram of the drive circuit according to the third implementation example. As shown in FIG. 7, a drive circuit 1C includes the driver 10 and a DESAT circuit 20C.

The DESAT circuit 20C includes the capacitor Cdesat (first capacitor), a resistor R211 (first resistor), a transistor Q23 (first transistor), a resistor R212 (second resistor), a resistor R213 (third resistor), and a transistor Q22C (second transistor), a resistor R217 (seventh resistor), the resistor R204 (fourth resistor), the resistor R205 (fifth resistor), the diode D22 (first diode), the diode D23 (third diode), the resistor R206 (sixth resistor), the buffer 31, and the diode Ddesat (second diode).

As shown in FIG. 7, in the DESAT circuit 20C, the capacitor Cdesat has one end connected to one end of the resistor R211 and another end grounded. The transistor Q23 is, for instance, an NPN type, and has the collector connected to another end of the resistor R211, the emitter grounded, and the base connected to one end of the resistor R212 and one end of the resistor R213. The resistor R212 has another end connected to one end of the resistor R217 and the collector of the transistor Q22C. The resistor R213 has another end grounded. The transistor Q22C has the emitter grounded and the base connected to one end of the resistor R204 and one end of the resistor R205. The resistor R204 has another end grounded. The resistor R217 has another end connected to the cathode of the diode D23 and another end of the resistor R206. The resistor R205 has another end connected to the anode of the diode D22. The diode D22 has the cathode connected to one end of the resistor R206 and the anode of the diode Ddesat. The diode D23 has the anode connected to the OUT terminal of the driver 10 and the input terminal of the buffer 31. The diode Ddesat has the cathode connected to the collector of the switching element 41. The buffer 31 has the Out terminal connected to the gate of the switching element 41.

As shown in Table g503 of FIG. 9, in the DESAT circuit 20C of the third implementation example, when the switching element 41 is in turn-off state, the diode D22 is turned off, the transistor Q23 and the transistor Q22C are turned off, and the transistor Q11 of the driver 10 is turned on.

As shown in Table g503 of FIG. 9, in the DESAT circuit 20C of the third implementation example, when the switching element 41 is in turn-on state and the Vce is lower than the first predetermined voltage value and normal, the diode D22 and the transistor Q22C are turned off, the transistor Q23 is turned on, and the transistor Q11 of the driver 10 is turned off. In the third implementation example, when the switching element 41 is in turn-on state and the Vce is lower than the first predetermined voltage value and normal, the diode D22 is turned off and the transistor Q23 is turned on, such that the DESAT terminal is set to 0 (V). Then, the current output from the DESAT terminal of the driver 10 is charged to the capacitor Cdesat of the DESAT circuit 20C up to the third predetermined voltage value of the equation (1).

As shown in Table g503 of FIG. 9, when the switching element 41 is in turn-on state and the Vce rises abnormally to equal to or higher than the first predetermined voltage value, in the DESAT circuit 20C, the diode D22 and the transistor Q22C are turned on, the transistor Q23 is turned off, and the transistor Q11 of the driver 10 is turned off. Then, the capacitor Cdesat starts charging the current output from the DESAT terminal of the driver 10, and when the reference voltage Vdesatth (second predetermined voltage value) or higher is reached, the charging operation is stopped. Then, the driver 10 outputs an abnormality detection signal to the control unit 30 after the mask time Tw when the capacitor Cdesat reaches the third predetermined voltage value, and switches the gate level of the switching element 41 to low-level according to the control of the control unit 30. The mask time Tw is determined by the following equation (3).

[Equation 3]

$$Tw = \frac{(Vdesatth - Idesat \times R211) \times Cdesat \text{ electrostatic capacitance}}{Idesat} \quad (3)$$

In the equation (3), Vdesatth is the reference voltage value, Idesat is the current value of the current source Idesat, and R211 is the resistance value of the resistor R211.

As shown in the equation (3), since the mask time Tw of the third implementation example does not include the term of the diode D21, it can set more accurately than the mask time Tw of the first implementation example and the second implementation example.

Fourth Implementation Example

Figure 8:
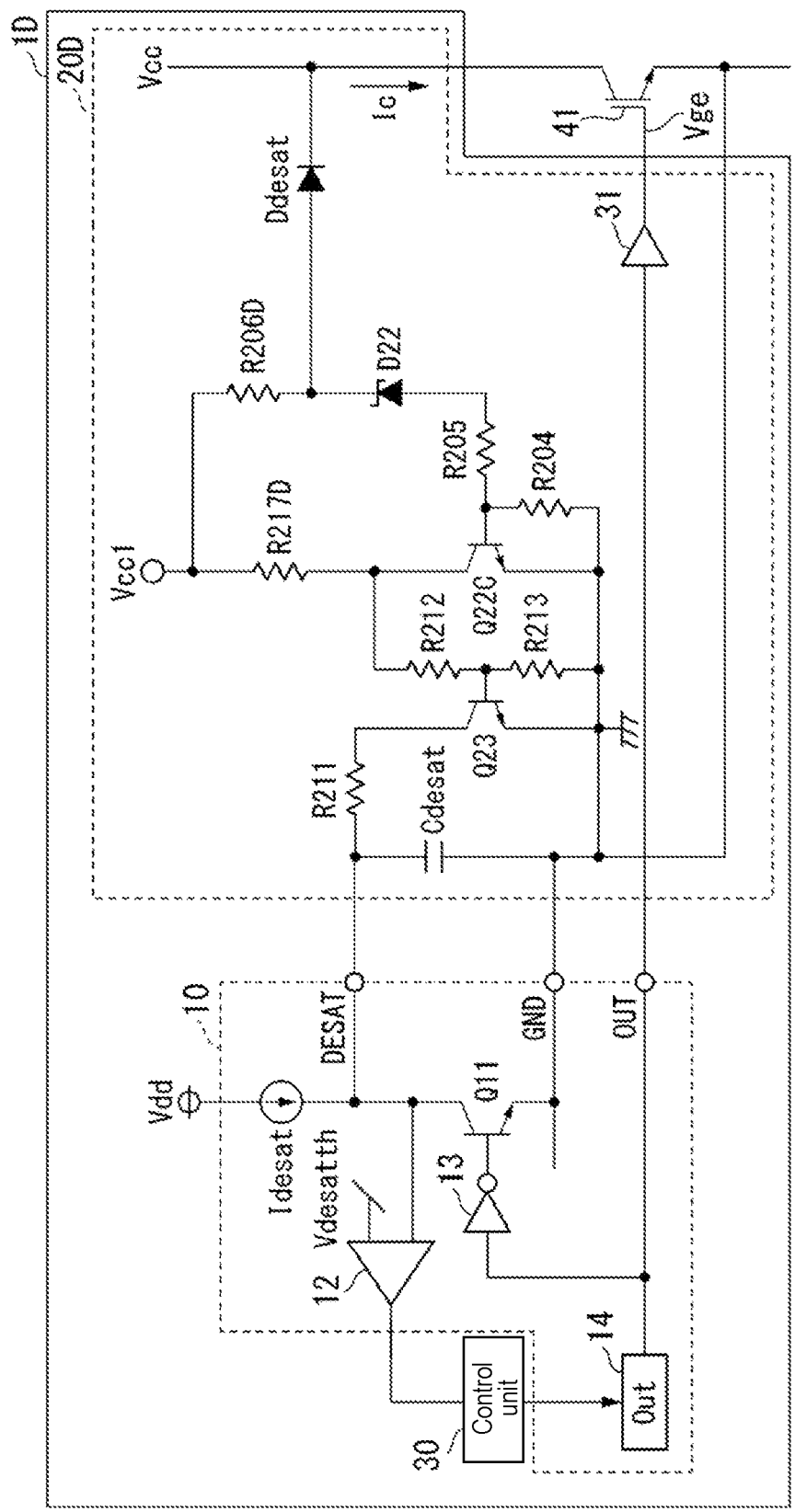
FIG. 8 is a circuit diagram of a drive circuit according to a fourth implementation example.

Next, a fourth implementation example will be described. FIG. 8 is a circuit diagram of the drive circuit according to the fourth implementation example. As shown in FIG. 8, a drive circuit 1D includes the driver 10 and a DESAT circuit 20D.

The DESAT circuit 20D includes the capacitor Cdesat (first capacitor), the resistor R211 (first resistor), the transistor Q23 (first transistor), the resistor R212 (second resistor), the resistor R213 (third resistor), and the transistor Q22C (second transistor), a resistor R217D (seventh resistor), the resistor R204 (fourth resistor), the resistor R205 (fifth resistor), the diode D22 (first diode), a resistor R206D (sixth resistor), the buffer 31, and the diode Ddesat (second diode) is provided.

As shown in FIG. 8, the DESAT circuit 20D does not include the diode D23 with respect to FIG. 7, and the positive voltage Vcc1 is connected to the resistor R217D and the resistor R206D.

In the DESAT circuit 20C of the third implementation example, the voltage is applied to the resistor R217 and the resistor R206 during the period when the pulse signal is at high-level, but in the DESAT circuit 20D of the fourth implementation example, a voltage is applied to the resistor R217D and the resistor R206D regardless of the level of the pulse signal.

As shown in Table g504 of FIG. 9, in the DESAT circuit 20D of the fourth implementation example, when the switching element 41 is in turn-off state, the diode D22 is turned on, the transistor Q23 is turned off, the transistor Q22C is turned on, and the transistor Q11 of the driver 10 is turned on.

As shown in Table g504 of FIG. 9, in the DESAT circuit 20D of the fourth implementation example, when the switching element 41 is in turn-on state and the Vce is lower than the first predetermined voltage value and normal, the diode D22 and the transistor Q22C are turned off, the transistor Q23 is turned on, and the transistor Q11 of the driver 10 is turned off. In the fourth implementation example, when the switching element 41 is in turn-on state and the Vce is lower than the first predetermined voltage value and normal, the diode D22 is turned off and the transistor Q23 is turned on, such that the DESAT terminal is set to 0 (V). Then, the current output from the DESAT terminal of the driver 10 is charged to the capacitor Cdesat of the DESAT circuit 20D up to the third predetermined voltage value of the equation (1).

As shown in Table g504 of FIG. 9, when the switching element 41 is in turn-on state and the Vce rises abnormally to equal to or higher than the first predetermined voltage value, the diode D22 and the transistor Q22C are turned on, the transistor Q23 is turned off, and the transistor Q11 of the driver 10 is turned off in the DESAT circuit 20D. Then, the capacitor Cdesat starts charging the current output from the DESAT terminal of the driver 10, and when the reference voltage Vdesatth (second predetermined voltage value) or higher is reached, the charging operation is stopped. Then, the driver 10 outputs an abnormality detection signal to the control unit 30 after the mask time Tw when the capacitor Cdesat reaches the third predetermined voltage value, and switches the gate level of the switching element 41 according to the control of the control unit 30. The mask time Tw is determined by the equation (3). Since the mask time Tw of the fourth implementation example does not include the term of the diode D21, it can be set more accurately than the mask time Tw of the first implementation example and the second implementation example.

In the case of the third implementation example and the fourth implementation example, the diode D21 provided in the first implementation example and the second implementation example is not provided. The reason why the diode D21 is unnecessary is that, in the case of the third implementation example and the fourth implementation example, an external voltage is not applied to the DESAT terminal of the driver 10 even when the transistor Q23 is turned on.

Next, examples of waveform simulation result will be described with respect to the configurations of the third implementation example and the fourth implementation example.

Figure 10:
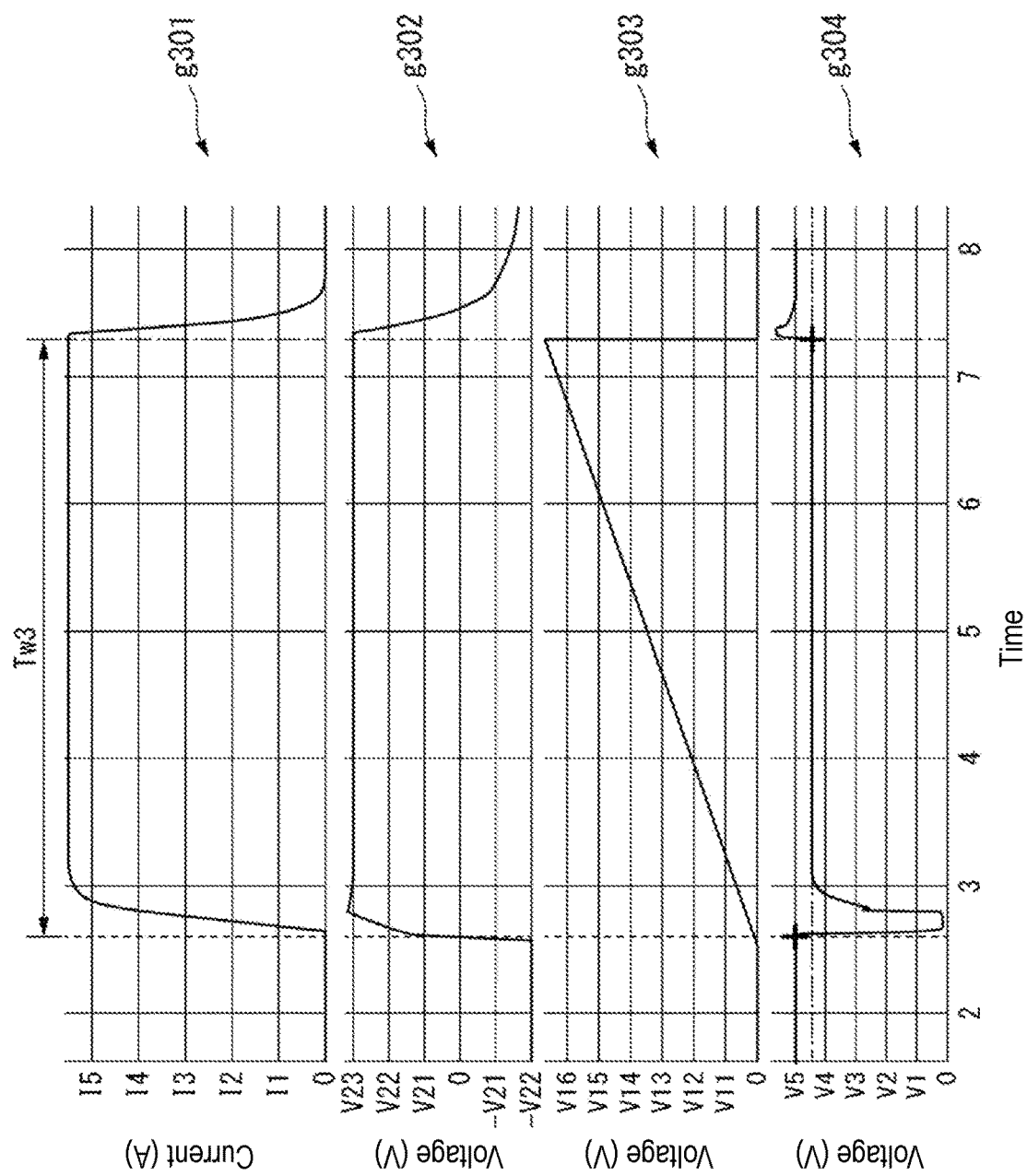
FIG. 10 is a diagram showing simulation waveforms when the inductance value of the load at short circuit is small in the third implementation example and the fourth implementation example.

FIG. 10 is a diagram showing simulation waveforms when the inductance value of the load at short circuit is small in the third implementation example and the fourth implementation example. In FIG. 10, the horizontal axis represents time (μs), and the vertical axis represents voltage value (V) and current value (A). Waveform g301 is a waveform of the current Ic. Waveform g302 is a waveform of the gate voltage Vge. Waveform g303 is a waveform of the voltage VDESAT. Waveform g304 is a waveform of voltage Vce.

As shown in FIG. 10, a mask time Tw3 when the inductance value of the load at short circuit is small is about 4.7 (μs).

Figure 11:
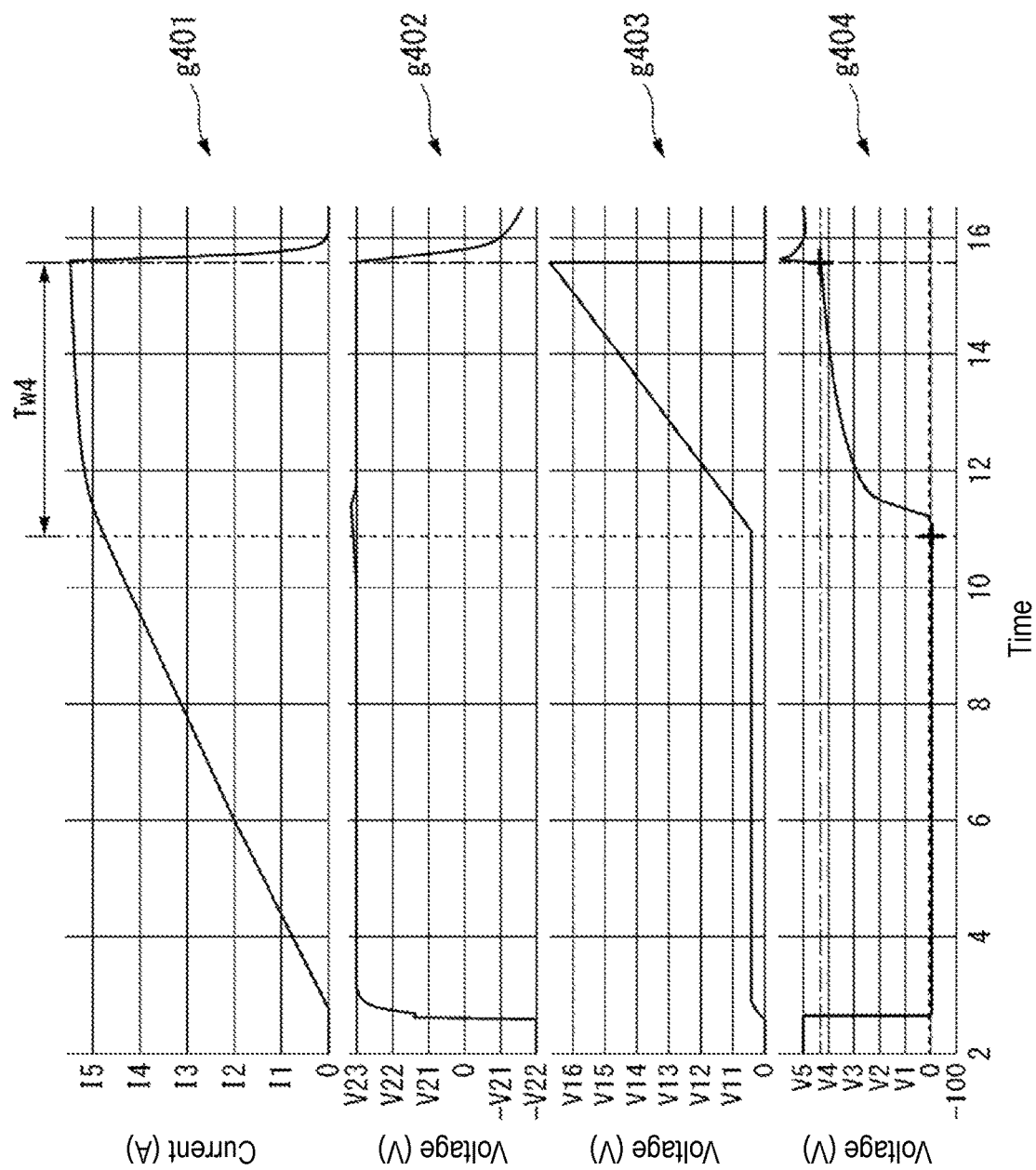
FIG. 11 is a diagram showing simulation waveforms when the inductance value of the load at short circuit is large in the third implementation example and the fourth implementation example.

FIG. 11 is a diagram showing simulation waveforms when the inductance value of the load at short circuit is large in the third implementation example and the fourth implementation example. In FIG. 11, the horizontal axis represents time (μs), and the vertical axis represents voltage value (V) and current value (A). Waveform g401 is a waveform of the current Ic. Waveform g402 is a waveform of the gate voltage Vge. Waveform g403 is a waveform of the voltage VDESAT. Waveform g404 is a waveform of voltage Vce.

As shown in FIG. 11, a mask time Tw4 when the inductance value of the load at short circuit is large is about 4.7 (μs).

According to the configurations of the third implementation example and the fourth implementation example as shown in FIGS. 10 and 11, the mask time is the same even if the inductance value of the load varies.

Here, in order to improve the accuracy of the mask time, for instance, in the DESAT circuit 20 of FIG. 1, the circuit of the circuit block 21 may be configured by, for instance, an open collector type comparator, resistors, capacitors, and diodes, and creating a threshold voltage in the DESAT circuit for comparison. In such a circuit configuration, the comparator compares the collector-emitter voltage of the switching element with a predetermined threshold voltage. However, in such a circuit configuration, the number of components will increase. For instance, the components include one comparator, four resistors, three capacitors, and two diodes. In a circuit having such a configuration, there are many components and the circuit cost is higher than that of the present embodiment. In the present embodiment, the diode D22 and the transistor Q22 play a role of a comparator. Further, in the present embodiment, the DESAT circuit 20 (20A, 20B, 20C, 20D) is set by the voltage at two ends of the diode D22 as described above.

In other words, according to the configuration of the present embodiment, the cost can be reduced and the number of parts can be reduced as compared with the case where the comparator is used in the DESAT circuit in this way.

In the above-described embodiments and each implementation examples, a configuration example in which a positive voltage is connected to the collector of the switching element 41 and the emitter is grounded has been described, but the disclosure is not limited thereto. The collector of the switching element 41 may be connected to the emitter of another switching element (not shown), and the emitter may be connected to the collector of another switching element.

Although the ways for carrying out the disclosure have been described above with reference to the embodiments and implementation examples, the disclosure is not limited to these embodiments. A variety of modifications and substitutions can be added without departing from the gist of the disclosure.

(3) Further, in the drive circuit according to one aspect of the disclosure, when the switching element is in turn-on state and the collector-emitter voltage of the switching element is lower than the first predetermined voltage value, the first diode is turned off; the first transistor and the second transistor are turned off; and, after a mask time in which the voltage value at two ends of the first capacitor, which is charged with the current from the current source, reaches a third predetermined voltage value different from the first predetermined voltage value and the second predetermined voltage value, the abnormality detection signal may be output to the control unit.

(4) Further, in the drive circuit according to one aspect of the disclosure, when the switching element is in turn-on state and the collector-emitter voltage of the switching element is lower than the first predetermined voltage value, the first diode and the second transistor are turned off; the first transistor is turned on; and, after a mask time in which the voltage value at two ends of the first capacitor, which is charged with the current from the current source, reaches a third predetermined voltage value different from the first predetermined voltage value and the second predetermined voltage value, the abnormality detection signal is output to the control unit.

(5) Further, in the drive circuit according to one aspect of the disclosure, the first transistor (Q21) may have a base connected to one end of a second resistor (R202) and one end of a third resistor (R203). The third resistor may have another end connected to a collector of the second transistor (Q22). The second transistor may have an emitter grounded and a base connected to one end of a fourth resistor (R204) and one end of a fifth resistor (R205). The fourth resistor may have another end grounded. The fifth resistor may have another end connected to an anode of the first diode (D22). The first diode may have a cathode connected to one end of a sixth resistor (R206) and an anode of a second diode (Ddesat). The sixth resistor may have another end connected to a cathode of a third diode, an emitter of the first transistor, and another end of the second resistor. The second diode may have a cathode connected to a collector of the switching element. The third diode may have the pulse signal input to an anode. The first capacitor (Cdesat) may have one end connected to the current source (Idesat) and an anode of a fourth diode (D21), and another end grounded. The fourth diode may have a cathode connected to one end of a first resistor (R201) and a collector of the first transistor. The first resistor may have another end grounded.

(6) Further, in the drive circuit according to one aspect of the disclosure, the first transistor (Q21) may have a base connected to one end of a second resistor (R202) and one end of a third resistor (R203), and an emitter connected to a positive voltage (Vcc1). The second resistor may have another other end connected to the positive voltage. The third resistor may have another end connected to a collector of the second transistor (Q22). The second transistor may have an emitter grounded and a base connected to one end of a fourth resistor (R204) and one end of a fifth resistor (R205). The fourth resistor may have another end grounded. The fifth resistor may have another end connected to an anode of the first diode (D22). The first diode may have a cathode connected to one end of a sixth resistor (R206) and an anode of a second diode (Ddesat). The sixth resistor may have another end connected to the positive voltage. The second diode may have a cathode connected to a collector of the switching element (41). The first capacitor (Cdesat) may have one end connected to the current source and an anode (Idesat) of a third diode (D23), and another end grounded. The third diode may have a cathode connected to one end of a first resistor (R201) and a collector of the first transistor. The first resistor may have another end grounded.

(7) Further, in the drive circuit according to one aspect of the disclosure, the first capacitor (Cdesat) may have one end connected to the current source (Idesat) and one end of the first resistor (R211), and another end grounded. The first resistor may have another end connected to a collector of the first transistor (Q23). The first transistor may have an emitter grounded and a base connected to one end of a second resistor (R212) and one end of a third resistor (R213). The third resistor may have another end grounded. The second transistor (Q22C) may have an emitter grounded and a base connected to one end of a fourth resistor (R204) and one end of a fifth resistor (R205). The fourth resistor may have another end grounded. The fifth resistor may have another end connected to an anode of the first diode (D22). The first diode may have a cathode connected to one end of a sixth resistor (R206) and an anode of a second diode (Ddesat). The sixth resistor may have another end connected to a cathode of a third diode (D23) and one end of a seventh resistor (R217). The seventh resistor may have another end connected to another end of the second resistor and a collector of the second transistor. The second diode may have a cathode connected to a collector of the switching element. The third diode may have the pulse signal input to an anode.

(8) Further, in the drive circuit according to one aspect of the disclosure, the first capacitor (Cdesat) may have one end connected to the current source (Idesat) and one end of a first resistor (R211), and another end grounded. The first resistor may have another end connected to a collector of the first transistor (Q23). The first transistor may have an emitter grounded and a base connected to one end of a second resistor (R212) and one end of a third resistor (R213). The third resistor may have another end grounded. The second transistor (Q22C) may have an emitter grounded and a base connected to one end of a fourth resistor (R204) and one end of a fifth resistor (R205). The fourth resistor may have another end grounded. The fifth resistor may have another end connected to an anode of the first diode (D22). The first diode may have a cathode connected to one end of a sixth resistor (R206D) and an anode of a second diode (Ddesat). The sixth resistor may have another end connected to a positive voltage (Vcc1). The seventh resistor (R217D) may have one end connected to the positive voltage and another end connected to another end of the second resistor and a collector of the second transistor. The second diode may have a cathode connected to a collector of the switching element (41).

According to the disclosure, the accuracy of the mask time can be improved.

What is claimed is:
1. A drive circuit, driving a switching element by a pulse signal, the drive circuit comprising:
   a first diode;
   a first transistor and a second transistor, turned off when the first diode is turned off and turned on when the first diode is turned on;
   a first capacitor;

a control unit, controlling whether or not to output the pulse signal to the switching element, wherein when the switching element is in turn-on state and a collector-emitter voltage of the switching element is equal to or higher than a first predetermined voltage value, the first diode is turned on; the first transistor and the second transistor are turned on; and, after a mask time in which the first capacitor is started to be charged with a current from a current source and a voltage value at two ends of the first capacitor becomes equal to or higher than a second predetermined voltage value higher than the first predetermined voltage value, an abnormality detection signal is output to the control unit, and the control unit stops an output of the pulse signal to the switching element in response to the abnormality detection signal, wherein the second transistor has an emitter grounded and a base directly connected to one end of a fourth resistor and one end of a fifth resistor;

the fourth resistor has another end grounded; and the fifth resistor has another end directly connected to an anode of the first diode.

2. The drive circuit according to claim 1, wherein when the switching element is in turn-on state and the collector-emitter voltage of the switching element is lower than the first predetermined voltage value, the first diode is turned off the first transistor and the second transistor are turned off and, after a mask time in which the voltage value at two ends of the first capacitor, which is charged with the current from the current source, reaches a third predetermined voltage value different from the first predetermined voltage value and the second predetermined voltage value, the abnormality detection signal is output to the control unit.

3. The drive circuit according to claim 1, wherein the first transistor has a base connected to one end of a second resistor and one end of a third resistor;

the third resistor has another end connected to a collector of the second transistor;

the first diode has a cathode connected to one end of a sixth resistor and an anode of a second diode;

the sixth resistor has another end connected to a cathode of a third diode, an emitter of the first transistor, and another end of the second resistor;

the second diode has a cathode connected to a collector of the switching element;

the third diode has the pulse signal input to an anode;

the first capacitor has one end connected to the current source and an anode of a fourth diode, and another end grounded;

the fourth diode has a cathode connected to one end of a first resistor and a collector of the first transistor; and the first resistor has another end grounded.

4. The drive circuit according to claim 1, wherein the first transistor has a base connected to one end of a second resistor and one end of a third resistor, and an emitter connected to a positive voltage;

the second resistor has another end connected to the positive voltage;

the third resistor has another end connected to a collector of the second transistor;

the first diode has a cathode connected to one end of a sixth resistor and an anode of a second diode;

the sixth resistor has another end connected to the positive voltage;

the second diode has a cathode connected to a collector of the switching element;

the first capacitor has one end connected to the current source and an anode of a third diode, and another end grounded;

the third diode has a cathode connected to one end of a first resistor and a collector of the first transistor; and the first resistor has another end grounded.

5. The drive circuit according to claim 2, wherein the first transistor has a base connected to one end of a second resistor and one end of a third resistor;

the third resistor has another end connected to a collector of the second transistor;

the first diode has a cathode connected to one end of a sixth resistor and an anode of a second diode;

the sixth resistor has another end connected to a cathode of a third diode, an emitter of the first transistor, and another end of the second resistor;

the second diode has a cathode connected to a collector of the switching element;

the third diode has the pulse signal input to an anode;

the first capacitor has one end connected to the current source and an anode of a fourth diode, and another end grounded;

the fourth diode has a cathode connected to one end of a first resistor and a collector of the first transistor; and the first resistor has another end grounded.

6. The drive circuit according to claim 2, wherein the first transistor has a base connected to one end of a second resistor and one end of a third resistor, and an emitter connected to a positive voltage;

the second resistor has another end connected to the positive voltage;

the third resistor has another end connected to a collector of the second transistor;

the first diode has a cathode connected to one end of a sixth resistor and an anode of a second diode;

the sixth resistor has another end connected to the positive voltage;

the second diode has a cathode connected to a collector of the switching element;

the first capacitor has one end connected to the current source and an anode of a third diode, and another end grounded;

the third diode has a cathode connected to one end of a first resistor and a collector of the first transistor; and the first resistor has another end grounded.

7. A drive circuit, driving a switching element by a pulse signal, the drive circuit comprising:

a first diode;

a first transistor;

a second transistor;

a first capacitor;

a control unit, controlling whether or not to output the pulse signal to the switching element, wherein when the switching element is in turn-on state and a collector-emitter voltage of the switching element is equal to or higher than a first predetermined voltage value, the first diode is turned on; the first transistor is turned off and the second transistor is turned on; and, after a mask time in which the first capacitor is started to be charged with a current from a current source and a voltage value at two ends of the first capacitor becomes equal to or higher than a second predetermined voltage value higher than the first predetermined voltage value, an abnormality detection signal is output to the control unit, and the control unit stops an output of the pulse signal to the switching element in response to the abnormality detection signal, wherein the second transistor has an emitter grounded and a base directly connected to one end of a fourth resistor and one end of a fifth resistor;

the fourth resistor has another end grounded; and the fifth resistor has another end directly connected to an anode of the first diode.

8. The drive circuit according to claim 7, wherein when the switching element is in turn-on state and the collector-emitter voltage of the switching element is lower than the first predetermined voltage value, the first diode and the second transistor are turned off; the first transistor is turned on; and, after a mask time in which the voltage value at two ends of the first capacitor, which is charged with the current from the current source, reaches a third predetermined voltage value different from the first predetermined voltage value and the second predetermined voltage value, the abnormality detection signal is output to the control unit.

9. The drive circuit according to claim 7, wherein the first capacitor has one end connected to the current source and one end of the first resistor, and another end grounded;

the first resistor has another end connected to a collector of the first transistor;

the first transistor has an emitter grounded and a base connected to one end of a second resistor and one end of a third resistor;

the third resistor has another end grounded;

the first diode has a cathode connected to one end of a sixth resistor and an anode of a second diode;

the sixth resistor has another end connected to a cathode of a third diode and one end of a seventh resistor;

the seventh resistor has another end connected to another end of the second resistor and a collector of the second transistor;

the second diode has a cathode connected to a collector of the switching element; and the third diode has the pulse signal input to an anode.

10. The drive circuit according to claim 7, wherein the first capacitor has one end connected to the current source and one end of a first resistor, and another end grounded;

the first resistor has another end connected to a collector of the first transistor;

the first transistor has an emitter grounded and a base connected to one end of a second resistor and one end of a third resistor;

the third resistor has another end grounded;

the first diode has a cathode connected to one end of a sixth resistor and an anode of a second diode;

the sixth resistor has another end connected to a positive voltage;

a seventh resistor has one end connected to the positive voltage and another end connected to another end of the second resistor and a collector of the second transistor; and the second diode has a cathode connected to the collector of the switching element.

11. The drive circuit according to claim 8, wherein the first capacitor has one end connected to the current source and one end of the first resistor, and another end grounded;

the first resistor has another end connected to a collector of the first transistor;

the first transistor has an emitter grounded and a base connected to one end of a second resistor and one end of a third resistor;

the third resistor has another end grounded;

the first diode has a cathode connected to one end of a sixth resistor and an anode of a second diode;

the sixth resistor has another end connected to a cathode of a third diode and one end of a seventh resistor;

the seventh resistor has another end connected to another end of the second resistor and a collector of the second transistor;

the second diode has a cathode connected to a collector of the switching element; and the third diode has the pulse signal input to an anode.

12. The drive circuit according to claim 8, wherein the first capacitor has one end connected to the current source and one end of a first resistor, and another end grounded;

the first resistor has another end connected to a collector of the first transistor;

the first transistor has an emitter grounded and a base connected to one end of a second resistor and one end of a third resistor;

the third resistor has another end grounded;

the first diode has a cathode connected to one end of a sixth resistor and an anode of a second diode;

the sixth resistor has another end connected to a positive voltage;

a seventh resistor has one end connected to the positive voltage and another end connected to another end of the second resistor and a collector of the second transistor; and the second diode has a cathode connected to the collector of the switching element.

* * * * *